(12) United States Patent
Nakasuji et al.

(10) Patent No.: US 6,194,102 B1
(45) Date of Patent: Feb. 27, 2001

(54) PATTERN-TRANSFER METHODS AND MASKS

(75) Inventors: Mamoru Nakasuji, Yokohama; Koichi Kamijo, Kawasaki, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/231,943

(22) Filed: Jan. 14, 1999

(30) Foreign Application Priority Data

Jan. 14, 1998 (JP) .................................................. 10-017637

(51) Int. Cl.$^7$ ...................................................... G03F 9/00
(52) U.S. Cl. .................................................. 430/5; 430/22
(58) Field of Search ........................... 430/5, 22, 296, 430/394; 250/492.22

(56) References Cited

U.S. PATENT DOCUMENTS

| 5,523,580 | 6/1996 | Davis | 250/505.1 |
| 5,958,626 | 10/1999 | Nakasuji | 430/5 |

FOREIGN PATENT DOCUMENTS

| 9-245915 | 8/1997 | (JP) . |
| 9-314595 | 10/1997 | (JP) . |

*Primary Examiner*—S. Rosasco
(74) *Attorney, Agent, or Firm*—Klarquist Sparkman Campbell Leigh & Whinston, LLP

(57) ABSTRACT

A pattern to be transferred to a wafer or other substrate is defined by a mask and divided into a plurality of sub-fields. The sub-fields include pattern lines having interconnection patterns for interconnecting patterns from the sub-fields on the wafer The interconnection patterns comprise one or more sections that transmit an incident charged-particle beam or light flux. The widths of the transmitting sections are selected to be less than or equal to the resolution limit of the optical system (CPB or light optical system) that images the sub-fields onto the wafer. In one embodiment, the widths of the transmitting sections monotonically increase or decrease at the ends towards the edges of the sub-fields. In another embodiment, the interconnection pattern is a square-spiral pattern formed of transmitting and absorbing segments. These interconnection patterns allow lines from connecting sub-field patterns to be connected with a reduced area of double-exposure even if the patterns are projected with an offset.

7 Claims, 7 Drawing Sheets

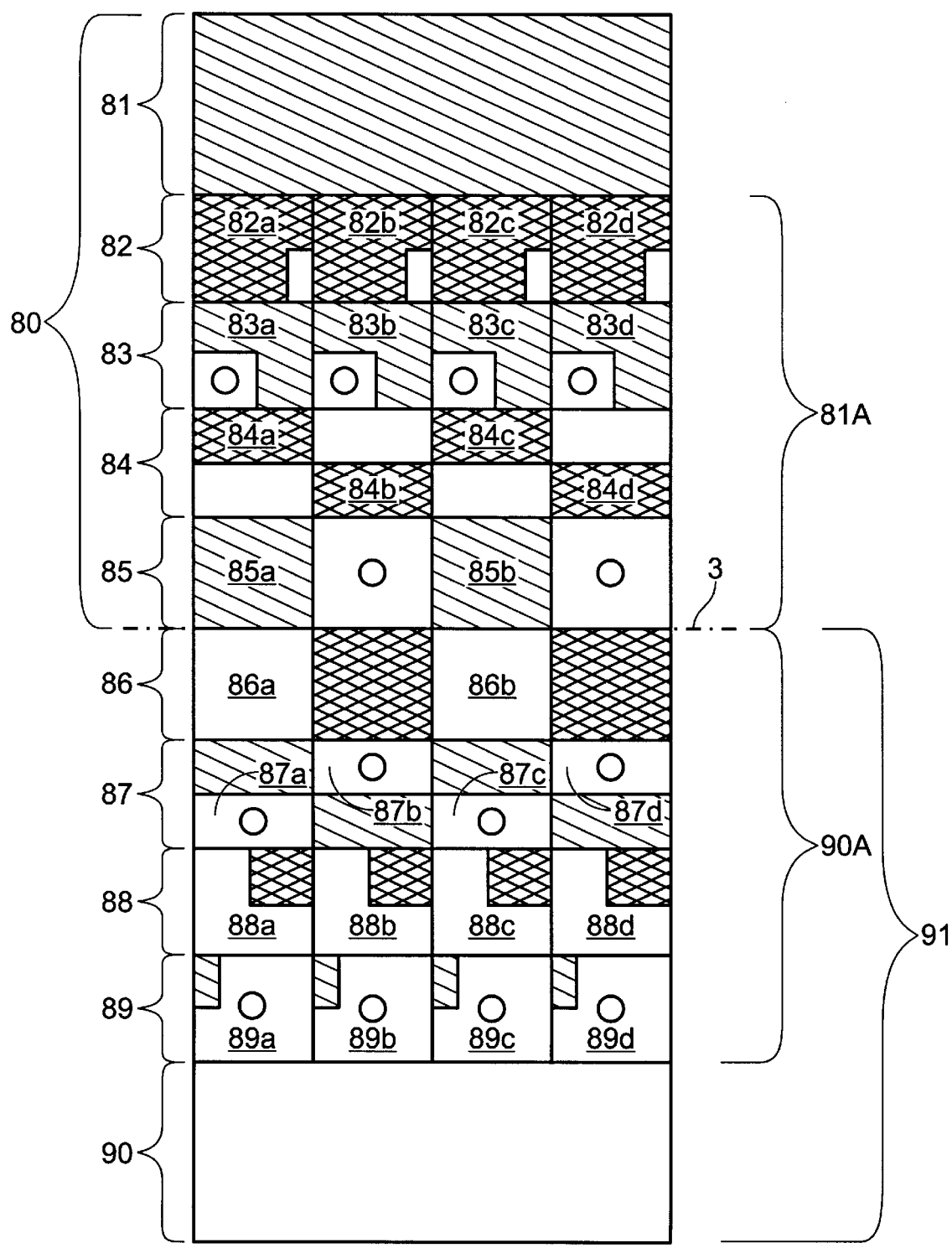

PATTERN-TRANSFER METHODS AND MASKS

FIELD OF THE INVENTION

The invention pertains to pattern transfer methods, apparatus, and masks for transferring patterns to a substrate such as a semiconductor wafer.

BACKGROUND OF THE INVENTION

Charged-particle-beam (CPB) pattern-transfer methods (such as electron-beam microlithography) take advantage of the high-resolution imagery available with electron beam optical systems. However, the throughput achieved with conventional CPB methods is low.

So-called "hybrid" pattern-transfer methods, known as "cell-projection," "character-projection," or "block exposure" are useful for transferring patterns containing large numbers of repeating subunits (each measuring, for example, about 5 $\mu$m by 5 $\mu$m). In hybrid pattern-transfer methods, one or more of the subunit patterns is defined by a mask and repeatedly transferred onto the wafer with a projection-exposure process. Such methods are particularly well suited for pattern transfer for the highly repetitive patterns of high-density memory chips (e.g., DRAMs). Hybrid pattern-transfer methods used in the production of a semiconductor integrated circuit (such as a DRAM) permit throughputs that are about one tenth the throughput achievable using other pattern-transfer methods.

Unfortunately, hybrid pattern-transfer methods improve throughput only for transferring patterns having significant repetition. For non-repetitive patterns, throughput is not improved because of the long times required to transfer the non-repetitive pattern portions to the wafer.

In so-called "divided-field" pattern-transfer methods, an entire circuit pattern for a semiconductor die is defined by a mask. An electron beam (or other CPB) irradiates an area of the mask and an electron-optical system projects a demagnified image of the irradiated area onto a wafer. The electron-optical system is typically a two-stage projection-lens system. Because the electron beam does not irradiate the entire circuit pattern simultaneously, the circuit pattern is divided into a number of fields or "stripes", and each stripe is further divided into sub-fields. The sub-fields are sequentially irradiated with the electron beam and imaged onto the wafer. The patterns from the sub-fields must be accurately connected ("stitched") on the wafer so that the entire die pattern is transferred. To control aberrations, the electron-optical system is adjusted for each sub-field. This method is discussed in, for example, U.S. Pat. No. 5,260,151 and Japanese laid-open patent document Hei 5-160012. Divided-field pattern-transfer methods permit excellent aberration control, but the commercial application of such methods in the fabrication of ULSI semiconductor devices is limited by their throughput.

A particularly important problem for these divided-field pattern-transfer methods is the precise stitching of the images of the mask sub-fields on the wafer. One method for connecting sub-field patterns is the "gray-splicing" method described in Japanese laid open patent document Sho 63-1032. In the gray-splicing method, mating edges of two sub-fields projected adjacent on the wafer have the same patterns and the patterns are projected to overlap on the wafer. The area of the wafer in which the patterns from the two sub-fields overlap receives two exposures, corresponding to the exposures of each of the two sub-fields. The dose (total charge per unit area) delivered to the wafer in each exposure is adjusted so that the total dose of the two exposures in the area of overlap equals the dose delivered to single-exposed areas of the wafer. Unfortunately, the gray-splicing method is applicable only to pattern-transfer methods using a variably shaped CPB or a focused CPB beam.

Idesawa et al. describe tapering the dose distribution of exposures made in a feature-connection area located between two adjacent sub-fields on the wafer. See Idesawa et al., "Discontinuity Reduction Method in Pattern Connection," *J. vac. Sci, Technol.*, 19 (4), November/December 1981, p. 983. This technique produces a constant dose over the entire wafer with inconspicuous stitching of patterns between the mating sub-fields. Unfortunately, however, this technique is applicable only when the beam shape is variable. In addition, tapering the dose distribution is difficult.

Another problem of the divided-field method is the difficulty of accurately stitching together the images of adjacent patterns on the wafer in the presence of distortion in the pattern-transfer apparatus optical system. This distortion problem is illustrated in FIG. 7. Images 498, 499 of respective square sub-fields on the wafer exhibit pincushion distortion caused by the optical system of the pattern-transfer apparatus. (The images can also exhibit barrel distortion.) Respective corners 498a, 499a of the distorted images 498, 499 overlap as imaged on the wafer, and the overlapping region is therefore overexposed by the pattern-transfer apparatus. In addition, because the images 498, 499 are distorted, a region 497 between the images 498, 499 remains unexposed. The unexposed region 497 can cause circuit defects such as short circuits or open circuits while the double exposure at the corners 499a, 499b can produce circuit features that are larger or smaller than intended.

One solution to these problems is described in Japanese laid open patent document Hei 7-2098550 and corresponding U.S. Pat. No. 5,523,580. With reference to FIG. 8, pattern line segments 500, 510 are defined by patterns in respective sub-fields. The pattern line segments terminate with respective end portions 501, 511. The pattern line segments 500, 510 and the respective end portions 501, 511 are imaged onto the wafer so that the end portions 501, 511 overlap and a continuous line is formed.

The end portions 501,511, define a checkerboard pattern with transmitting sections such as exemplary squares 501a, 501b (shown in FIG. 8 as squares with hatch marks) and absorbing sections such as exemplary squares 501c, 501d (shown in FIG. 8 without hatch marks). When the images of the two adjacent line patterns are projected on the wafer, the end portions 501 and 511 overlap on the wafer, so that the transmitting sections of the end portion 501 coincide with the absorbing sections of the end portion 511, and vice versa. Thus, the checkerboard patterns formed on the end portions 501 and 511 are complementary. If the images of the sub-fields are accurately projected onto the wafer without distortion, the images form a single continuous straight line with no overexposed or underexposed regions because of the patterns of the end portions 501, 511 are complementary Another prior-art solution is illustrated in FIG. 9. Pattern lines 600, 610 are defined by respective sub-fields and include triangular end portions 601, 611. (The hatched areas in FIG. 9 represent transmitting sections) The pattern lines 600, 610 are ideally projected to form a single straight line.

These prior-art methods have several disadvantages. Individual squares such as exemplary absorbing squares 501c, 501d of the checkerboard pattern 501 are almost completely surrounded by transmitting sections such as squares 501a, 501b. Thus, the transmitting section 501a is not adequately supported and additional support must be provided. For example, a two-layer mask construction can be used in which an absorbing material is supported by a transmitting layer. However, fabrication of such a two-layer mask is difficult and the exposure contrast obtained with such a mask is less than that of a single-layer mask. In addition, the transmitting supporting layer is heated by the charged-particle beam.

Referring again to FIG. 9, the triangular end portions 601, 611 are not complementary. Accordingly, if the images of pattern lines 600, 610 (and the triangular end portions 601, 611) are offset due to distortion or misalignment, short circuits, open circuits or other defects arise. Even if the images are precisely connected, the wafer is overexposed in areas corresponding to the triangular end portions 610, 611.

SUMMARY OF THE INVENTION

In view of the shortcomings of the prior art as summarized above, an object of the invention is to provide pattern-transfer methods, apparatus, and masks that enable the reduction of interconnection errors. Another object is to provide pattern-transfer methods, apparatus, and masks that provide seamless interconnections of sub-fields as projected onto the wafer and uniform wafer exposure.

According to one aspect of the invention, pattern-transfer methods for transferring a pattern defined on a mask to a wafer or other substrate using a pattern-transfer apparatus are provided. A representative embodiment of a pattern-transfer method comprises dividing the pattern into a plurality of sub-fields and defining the pattern of the sub-fields on the mask. The sub-fields include pattern lines terminating in interconnection patterns. An interconnection pattern comprises one or more transmitting pattern segments arranged longitudinally with respect to the corresponding pattern line. The transmitting pattern segments are selected to have widths less than or equal to a resolution limit of a projection-optical system of the pattern-transfer apparatus. The pattern is transferred to the wafer by sequentially irradiating the sub-fields and projecting patterns from the sub-fields onto the wafer with the projection-optical system. The sub-field patterns are projected so that interconnection patterns of the sub-fields overlap, thereby interconnecting the pattern lines of the sub-fields. The widths of the transmitting pattern segments can increase or decrease monotonically in a longitudinal direction.

The pattern can be divided so that sub-field boundaries coincide with the boundary of the optical field of the optical system or the boundary of the deflection range of the electron beam.

According to another aspect of the invention, masks for pattern-transfer are provided. According to a representative embodiment, a pattern is divided into sub-fields including pattern lines with interconnection patterns. The interconnection patterns include transmitting pattern segments having widths that decrease or increase monotonically in a longitudinal direction. The widths of the patterns segments can be less than or equal to a resolution limit of an optical system used to project the sub-field patterns onto a wafer.

According to another representative embodiment, a mask is provided that includes a plurality of pattern lines and corresponding interconnection patterns. The interconnection patterns terminate the respective patterns lines and include transmitting and absorbing pattern segments. The interconnection patterns that connect selected pattern sections are complementary and are projected to overlap on the wafer.

According to another representative embodiment, a mask is provided that includes a plurality of sub-fields that have respective pattern lines terminating in interconnection patterns. The interconnection patterns include transmitting pattern segments that are arranged in a square spiral. The pattern lines from selected sub-fields are projected onto a wafer to so that a connected line is formed by the interconnection of the square spiral interconnection patterns. The square spiral pattern permits the transmitting and absorbing pattern segments of the interconnection pattern to be continuous and hence the pattern does not require additional mechanical support. Square spiral interconnection patterns include alternating transmitting and absorbing pattern segments along lines parallel and perpendicular to the pattern lines. Because such pattern segments alternate along both directions, the interconnection patterns provide satisfactory line interconnections even if the patterns are projected with an offset or other image error.

The transmitting pattern segments can be provided with one or more teeth or analogous serrations that can be repeated at a fixed spacing. Such an arrangement further reduces double exposure and underexposure.

A mask according to another representative embodiment defines a circuit pattern divided into sub-fields. The sub-fields include interconnection patterns for interconnecting patterns from the sub-fields as projected onto a wafer or other substrate. The interconnection patterns include transmitting and absorbing pattern segments having widths selected to be less than or approximately equal to a resolution limit of an optical system used to project the sub-field patterns onto the wafer.

The above and other objects, features, and advantages of the present invention will be apparent from the following detailed description of various representative embodiments with reference to the attached drawings.

BRIEF DESCRIPTION OF THE DRAWINGS

FIG. 3 is a plan view illustrating interconnection patterns according to a second representative embodiment.

DETAILED DESCRIPTION

Figure 1A:
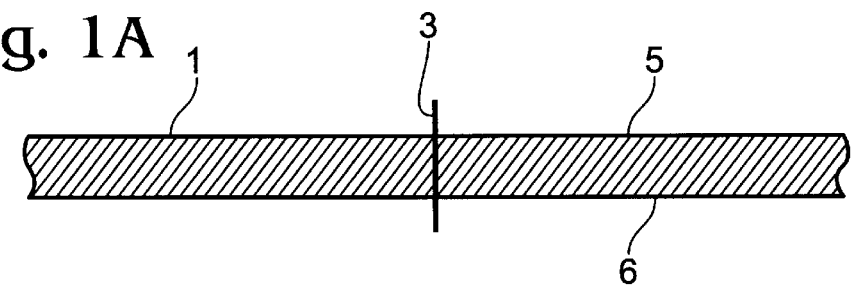
FIG. 1A is a plan view illustrating an ideal interconnection between patterns from a first and a second sub-field according to a first representative embodiment.

Masks for charged-particle beam (CPB) or optical pattern-transfer methods define circuit patterns as corresponding patterns of transmitting and absorbing regions. In some pattern-transfer methods, scattering regions are used instead of absorbing regions. For convenience, a mask region intended to absorb or scatter an incident CPB or light flux is referred to herein as an "absorbing" region. In addition, example embodiments are discussed with reference to CPB pattern-transfer, but other pattern-transfer methods including optical, X-ray, and ultraviolet pattern-transfer can be used as well.

For convenience in describing example embodiments, interconnection patterns from different sub-fields are referred to as "complementary" if a substrate area onto which the patterns are transferred so as to interconnect with each other has substantially no regions of double exposure or underexposure in the absence of misalignment and optical system resolution limitations, whether from aberrations or diffraction.

Pattern lines that include interconnection patterns are defined in sub-fields of a mask, The interconnection patterns serve to facilitate the interconnection of patterns from the sub-fields and include pattern segments. For convenience, a direction parallel to a pattern line is referred to as "longitudinal" and a linear dimension of a pattern segment measured longitudinally is referred to as a "width" of the pattern segment.

General aspects of a demagnifying charged-particle-beam (CPB) pattern-transfer apparatus are illustrated with reference to FIG. 10. An electron gun 111 produces an electron beam EB that propagates along an optical axis AX. The illustrative CPB apparatus of FIG. 10 uses the electron beam EB, but other of various other charged-particle beams can be used, such as an ion beam. The electron beam EB passes through first and second condenser lenses 113, 115, respectively The condenser lenses 113, 115 condense the electron beam EB to a first crossover CO1 located on the optical axis AX in the plane (transverse to the optical axis AX) of a blanking aperture 117. The condenser lenses 113, 115 function as zoom lenses, and can vary the current density of the electron beam EB for illuminating a mask 120 (also referred to as a reticle)

A first aperture 112 (preferably rectangular in transverse profile) is situated immediately upstream of the first condenser lens 113, and a second aperture 116 (preferably rectangular in transverse profile) is positioned downstream of the condenser lens 115. The apertures 112, 116 are also termed "sub-field-limiting apertures", and shape the transverse profile of the electron beam EB to correspond with dimensions of an irradiated sub-field on the mask 120. For example, the first aperture 112 shapes the electron beam EB so that the transverse profile of the electron beam is approximately 1 mm by 1 mm at the mask 120. The mask 120 extends in an X-Y plane, transverse to the optical axis AX. A patterned area of the mask 120 is divided into one or more columns, referred to herein as stripes. The stripes are divided into one or more sub-fields.

An image of the first aperture 112 is focused on the second aperture 116 by the condenser lenses 113, 115. A third condenser lens 119 is positioned downstream of a sub-field-selection deflector 118. The sub-field-selection deflector 118 is located downstream of the second aperture 116 and is aligned with a blanking aperture 117 in the plane of the crossover CO1. The third condenser lens 119 collimates the electron beam EB so that a collimated electron beam is incident on the mask 120, and an image of the second aperture 116 is focused on the mask 120. The sub-field-selection deflector 118 deflects the electron beam EB illuminating the mask 120 in the X-direction to successively illuminate all of the sub-fields in a selected stripe The mask 120 is retained by a mask stage 121 that moves the mask 120 in the X- and Y-directions. A wafer 124 is retained by a wafer stage 125 that moves the wafer 124 in the X- and Y-directions. By continuously moving the mask stage 121 and the wafer stage 125 in opposite directions parallel to the Y-axis, while deflecting the electron beam EB in the X-direction, patterns from the sub-fields of a selected stripe are imaged onto and transferred to the wafer 124. In addition, by shifting the mask stage 121 and the wafer stage 124 in the X-direction in a step-wise manner, patterns from additional stripes are situated for transfer to the wafer 124.

Figure 10:
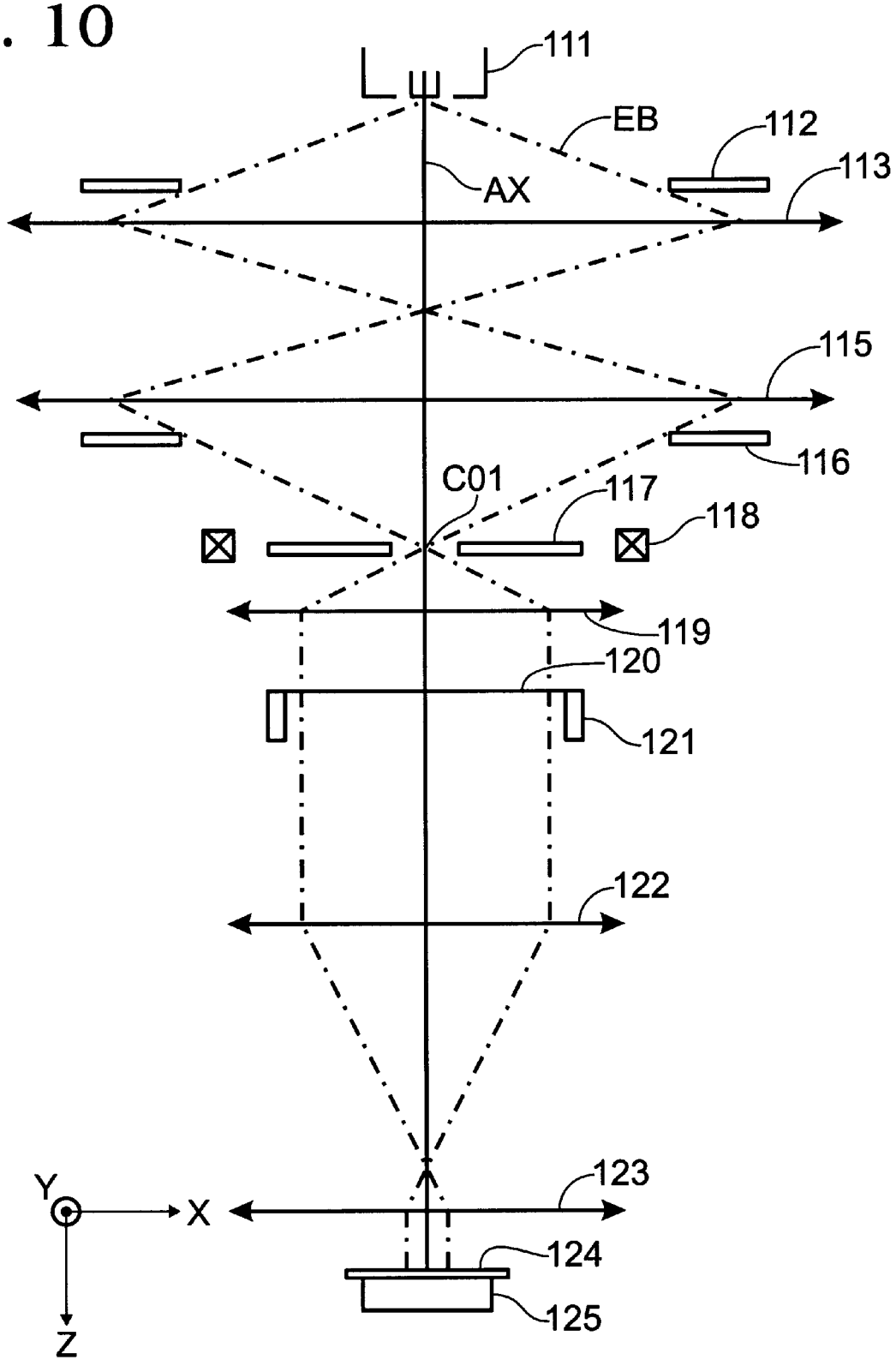
FIG. 10 is a schematic view of an exemplary charged-particle-beam pattern-transfer apparatus.

The mask stage 121 and the wafer stage 124 are provided with accurate position-monitoring systems such as laser interferometers (not shown in FIG. 10). In addition, alignment and deflection controllers (not shown) are provided so that the patterns of the sub-fields within a selected stripe are properly stitched on the wafer 124.

Two projection lenses 122 and 123 (the lens 123 is an objective lens), and a deflector (not shown) are positioned below the mask 120. The projection lenses 122, 123 direct the electron beam EB, after transmission by a sub-field, onto a selected location on the wafer 124. The projection lenses 122, 123 form a demagnified image of the sub-field on the wafer 124 and the deflector scans the electron beam EB in the X-direction across the wafer 124. The wafer 124 is coated with an appropriate resist so that exposure of the resist to the electron beam EB forms a pattern corresponding to the pattern of the irradiated sub-field. When a dose or "shot" of the electron beam EB strikes the resist, a pattern image of the irradiated sub-field is transferred onto the wafer 124.

Pattern-transfer of mask patterns intended to interconnect or be "stiched" on a wafer can exhibit several types of errors. For example, two patterns intended to interconnect to form a circuit line can be transferred with a gap between the two patterns ("gap") transferred so that the patterns overlap ("overlap"), or transferred so that the patterns are displaced in a direction transverse to the circuit line ("slip"). In addition, the patterns can be rotated with respect to each other. Such a rotational error can be regarded as a changing gap or overlap error. For convenience, pattern-transfer errors such as gap, overlap, slip, and rotational error are referred to as "offset" errors herein.

Figure 1B:
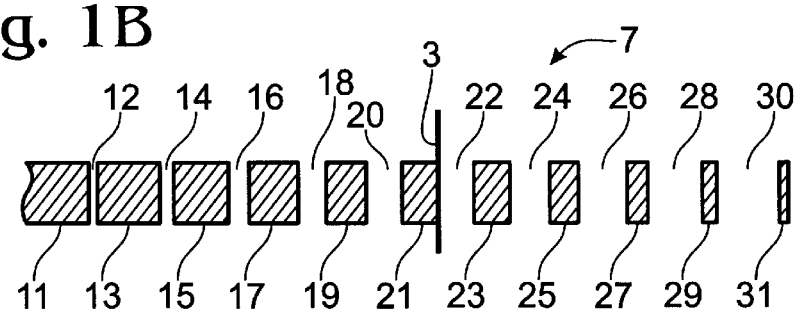
FIG. 1B is a plan view of an interconnection pattern of the first sub-field of FIG. 1A according to the first representative embodiment.
Figure 1C:
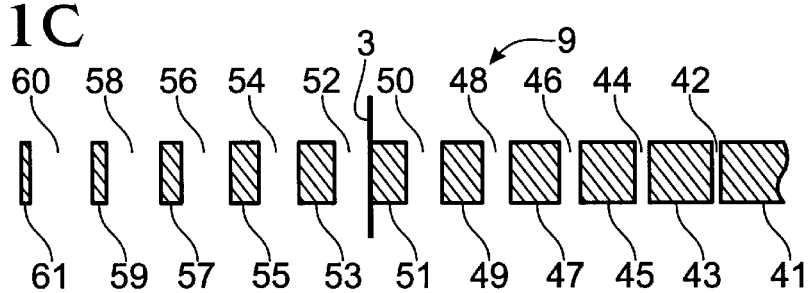
FIG. 1C is a plan view of an interconnection pattern of the second sub-field of FIG. 1A.

A portion of a mask according to a first representative embodiment is illustrated in FIG. 1B. An interconnection pattern 7 of a first exemplary sub-field on a mask such as the mask 120 comprises alternating transparent pattern sections 13, 15, 17, 19, 21, 23, 25, 27, 29, 31 and absorbing (or scattering) pattern sections 12, 14, 16, 18, 20, 22, 24, 26, 28, 30 extending from a pattern line 11. A complementary interconnection pattern 9 of a second exemplary sub-field extending from a pattern line 41 that is intended to connect to the pattern line 11 of the first sub-field is illustrated in FIG. 1C. The hatched areas indicate transmitting pattern sections, and the white areas indicate absorbing pattern sections.

Figure 1D:
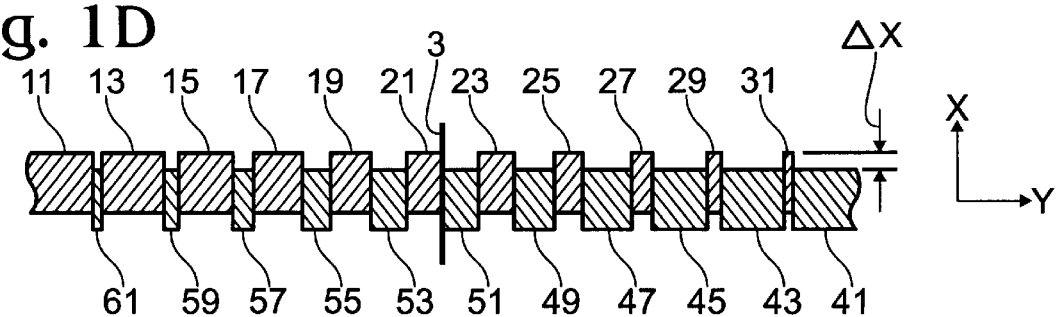
FIG. 1D is a plan view showing the interconnection patterns of the first and second sub-fields of FIGS. 1B–1C transferred to a substrate with an offset.

With a CPB pattern-transfer apparatus such as that of FIG. 10 or other pattern-transfer apparatus, the interconnection patterns 7, 9 are transferred onto the wafer to ideally form a line 6, as illustrated in FIG. 1A. The wafer receives respective exposures ("shots") and corresponding doses from each of the interconnection patterns 7, 9. The line 6 of FIG. 1A is formed by ideal pattern-transfer, i.e., the interconnection patterns 7, 9 are transferred to the wafer without offset, rotational errors, or optical system defects such as distortion. Note that if pattern-transfer occurs with no errors, pattern lines 1, 5 lacking any discernible interconnection patterns are transferred to form the continuous line 6 across the interface 3. If the interconnection patterns, 7, 9 are transferred with a slight offset ΔX (measured perpendicular to the length of the pattern line 6), then a pattern shown in FIG. 1D is produced on the wafer.

The interconnection patterns 7, 9 extend beyond the interface 3 that would be produced with a conventional mask. Because the sub-fields include interconnection patterns, the dimensions of the sub-fields must be increased by, for example, about 0.5 μm. The pattern lines 11, 41 are connected into a single pattern line 6 on the wafer by transferring the respective images of the pattern lines 11, 41 and the interconnection patterns 7, 9 so that the interconnection patterns mesh as projected on the wafer. The area of the wafer corresponding to the interconnection patterns 7, 9 is exposed twice.

With reference to FIG. 1B, the pattern line 11 defined by the first sub-field extends from an edge 11a into the interior of the first sub-field (i.e., extending leftward in the figure). The absorbing pattern section 12 is adjacent the pattern line 11 between the pattern line 11 and the transparent pattern section 12. Absorbing pattern sections 14, 16, 18, 20, 22, 24, 26, 28, 30 alternate with transmitting pattern sections 15, 17, 19, 21, 23, 25, 27, 29, 31. (In FIGS. 1B–1D, absorbing pattern sections are shown without hatch marks and the transparent pattern sections are indicated with hatch marks). The widths of the absorbing pattern sections 12, 14, 16, 18, 20, 22, 24, 26, 28, 30 gradually increase from pattern section 12 to pattern section 30 and the widths of the transparent pattern sections 13, 15, 17, 19 , 21, 23, 25, 27, 29, 31 gradually decrease from pattern section 13 to pattern section 31. In the embodiment of FIGS. 1B–1D, the ratios of the widths of successive absorbing pattern sections are 1:2:3:4:5:6:7:8:9; and the ratios of the widths of successive transparent sections are 9:8:7:6:5:4:3:2:1. In this embodiment, the widths of the transparent and absorbing pattern sections change monotonically from the pattern line 11 toward the edge of the respective sub-field. However, the widths of some pattern sections can be equal, and the widths of the pattern sections can both increase and decrease and the widths of the pattern sections need not change monotonically.

The interconnection pattern 9 of FIG. 1C is complementary to the interconnection pattern 7 of FIG. 1B and therefore the widths of absorbing pattern sections 42, 44, 46, 48, 5S, 52, 54, 56, 58, 60 and transparent pattern sections 43, 45, 47, 49, 51, 53, 55, 57, 59, 61 vary as the widths of corresponding pattern sections of the interconnection pattern 7.

Because pattern-transfer apparatus similar to that of FIG. 10 generally have demagnifications of between about ¼ and ⅕, it is relatively easy to form the interconnection patterns 7, 9. As shown in FIG. 1A, about one-half of the interconnection patterns 7, 9 extend beyond the interface 3.

The widths of the pattern sections of the interconnection patterns 7, 9 can be selected to be approximately less than or equal to a resolution limit of the pattern-transfer apparatus. For example, the resolution limit of a pattern-transfer apparatus such as that of FIG. 1 is approximately 0.1 μm. Therefore, the image of pattern segments of this size or less is substantially blurred with respect to a perfect image.

The interconnection patterns 7, 9 are complementary and ideally mesh perfectly to form the pattern line 6 of FIG. 1A. However, in practice, the interconnection patterns 7, 9 and corresponding pattern lines 11, 41 are projected on the wafer with a slight offset in either the X- or Y-directions as shown in FIG. 1D. In addition, the projected images can exhibit image aberrations such as distortion. If the pattern sections are comparable in size to the resolution limit of the pattern-transfer apparatus, then the pattern-section images exhibit blurring.

Figure 2A:
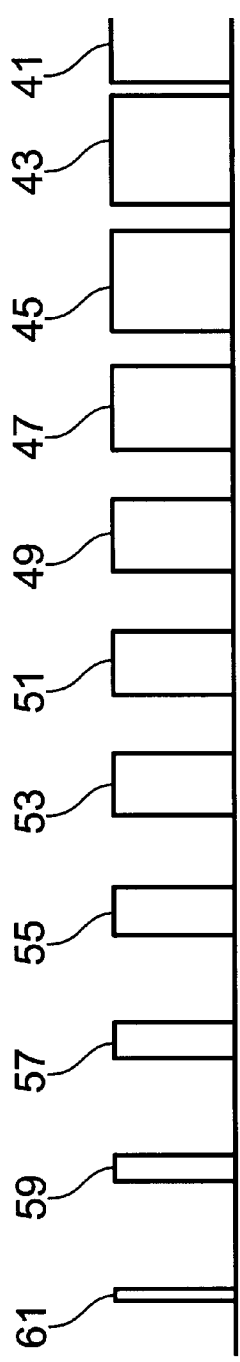
FIG. 2A is a graph of electron-beam dose as a function of position on the wafer produced by exposure of the interconnection pattern of FIG. 1C with an optical system having no resolution limit.
Figure 2B:
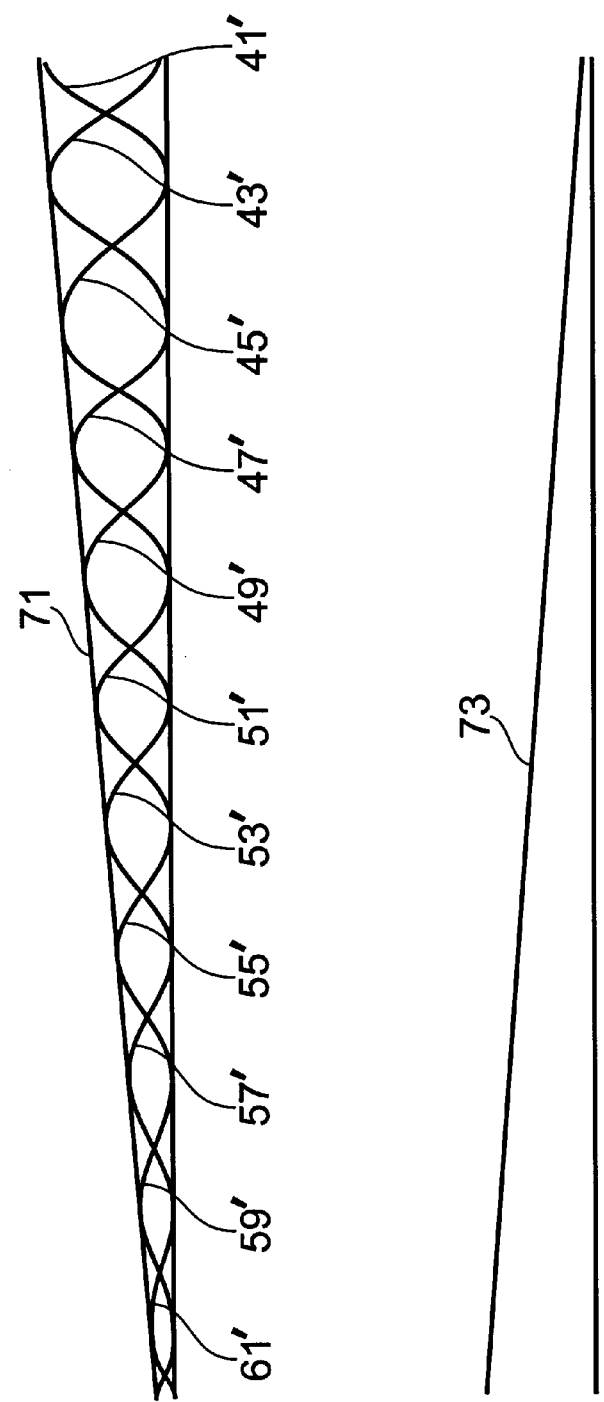
FIG. 2B is a graph of electron-beam dose as a function of position on produced by exposure of pattern segments of the interconnection pattern of FIG. 1C with an optical system having a resolution limit.
Figure 2C:
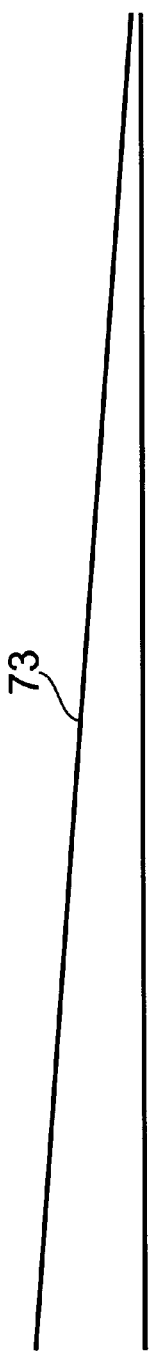
FIG. 2C is a graph of total electron-beam dose as a function of position produced by exposure of the interconnection pattern of FIG. 1C with an optical system having a resolution limit.

The dose as a function of position received by the wafer from the image of the interconnection patterns 7, 9 is shown in FIGS. 2A–2C. The horizontal axis represents the position in a direction parallel to the pattern lines 11, 41 as projected onto the wafer (X-direction), and the vertical axis represents the magnitude of the dose. With reference to FIG. 2A, the dose as a function of position on the wafer is shown assuming perfect imaging (idea, without aberrations or a resolution limit). Dose curves corresponding to the various transparent pattern sections 43, 45, 47, 49, 51, 53, 55, 57, 59, 61 and the pattern line 41 are denoted using the reference numeral of the corresponding pattern section or the pattern line 41. The widths of the respective dose curves, assuming ideal imaging, correspond to the widths of the respective pattern segments and edges of the images of the various pattern segments exhibit little blur.

FIG. 2B shows dose curves for the interconnection 9 taking into consideration imaging defects, in particular, the resolution limit of the pattern-transfer optical system. If the widths of the pattern sections are less than the resolution of the pattern-transfer apparatus optical system, then the dose curve for each of the transparent pattern sections 43, 45, 47, 49, 51, 53, 55, 57, 59, 61 is approximately a Gaussian curve in which the full width at half the maximum of the dose curve equals the resolution limit of the optical system and the total dose is proportional to the width of the respective pattern segment. Individual dose curves 43', 45', 47', 49', 51', 53', 55', 57', 59', 61' for the respective pattern sections 43, 45, 47, 49, 51, 53, 55, 57, 59, 61 are illustrated in FIG. 2B. (The dose curves are denoted with the reference numeral of the corresponding pattern segment to which a prime (') is added.) A dose curve 71 is obtained by summing the individual doses of the dose curves 43', 45', 47', 49', 51', 53', 55', 57', 59', 61'. The dose curve 71 is approximately a straight line and represents a dose that varies linearly.

With reference to FIG. 2C, summing doses for the pattern sections of the interconnection pattern 7 produces a linearly varying dose curve 73 having a slope opposite that of the dose curve 71. Summing the doses represented by the dose curves 71, 73 produces a constant dose. Even if the interconnection patterns 7, 9 are projected onto the wafer with an offset or slip error, the resulting dose is a smoothly varying, continuous line. The images of the pattern sections 13, 15 produce the largest doses on the left side of the pattern interface 3 while the images of the pattern sections 45, 43 are dominant on the right side. The images connect smoothly near the interface 3 because the widths of the middle pattern sections are smaller than the resolution limit of the optical system.

In the embodiment of FIGS. 1A–1D, the images of the pattern lines from two adjacent sub-fields are transferred onto the wafer so that the pattern lines are connected at a sub-field boundary. However, if the mask pattern itself is divided into a plurality of complementary patterns in order to avoid the so-called doughnut effect, multiple exposures may be necessary at other areas on the wafer. If the mask is divided for this purpose, then the interconnection patterns 7, 9 can also be used to form pattern connections with a sub-field.

In a second embodiment illustrated in FIG. 3, pattern lines 81, 90 from respective sub-fields are interconnected with respective interconnection patterns 81A, 90A. The embodiment of FIG. 3 is applicable to the interconnection of sub-field patterns at the boundary of two sub-fields.

In an area 80 (above the boundary 3), hatched sections such as the pattern line 81 and pattern segments 82a–82d, 83a–83d, 84a–84d, 85a–85b are transmitting. In an area 91 (below the boundary 3), unhatched sections such as the pattern line 90 and the pattern segments 89a–89d, 88a–88d, 87a–87d, 86a–86b are transmitting (transparent to the charged-particle beam). The pattern line 81 is a portion of a line segment of a first sub-field and receives a full dose in the exposure of the first sub-field (the "upper dose"). For convenience, a full dose from exposure with a single shot is referred to herein as a 100% dose. The hatched pattern segments 82a–82d receive an 87.5% dose from the upper dose and a 12.5% dose from exposure of the sub-field containing the pattern line 90 (the "lower dose"). In a region 83, 25% of the total exposure is produced by the lower dose. Pattern segments 84a–84d, 85a–85b, 86a–86b, 87a–87d of respective regions 84, 85, 86, 86 receive a 50% dose from each of the upper and lower doses. The pattern segments 88a–88d of the region 88 receive a 75% dose from the lower dose and the pattern segments 89a–89d of a region 89 receive an 87.5% dose from the lower dose.

The double-hatched segments (e.g., the pattern segments 82a–82d, 84a–84d) and segments including a respective circle (erg., pattern segments 89a–89d) are complementary segments that are divided to avoid being isolated by transmitting regions or supported only at corners.

Using the interconnection patterns 81A, 90A of FIG. 3, interconnection of the pattern lines 81, 90 is smooth because the dose from one of either the lower or upper dose dominates.

In the embodiments described above, symmetric interconnection patterns are used. The interconnection patterns include one or more transmitting (transparent) sections and one or more absorbing or scattering sections. The widths of the transmitting sections gradually vary at the end of a pattern line. With this arrangement, the images of the sub-field patterns can be transferred onto the wafer as a smooth, continuous line, even with uniform illumination of the mask. Varying the dose is unnecessary.

Figure 4:
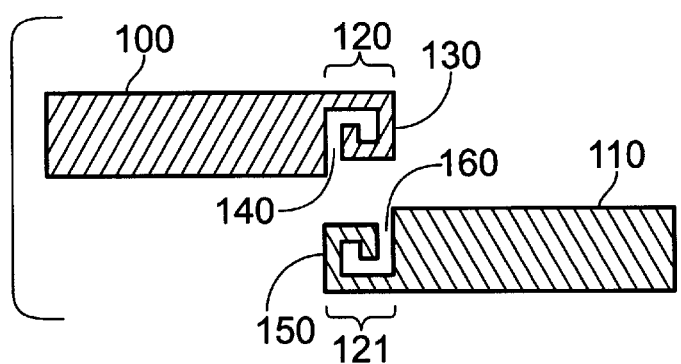
FIG. 4 illustrates pattern lines including interconnection patterns according to a third representative embodiment.

With reference to FIG. 4, pattern lines 100, 110 of a first sub-field and a second sub-field, respectively, terminate in respective interconnection patterns 120, 121. The pattern lines 100, 110 are to be imaged onto a wafer or other substrate so that a single continuous line is formed. The pattern lines 100, 110 are offset in FIG. 4 for convenience. The hatched areas indicate transmitting sections. The interconnection patterns 120, 121 have respective square-spiral transmitting areas 130, 150 and respective opaque (absorbing or scattering) areas 140, 160. The transmitting area 130 and the absorbing area 140 have the same size and shape and are complementary. Because the absorbing area 140 is not completely surrounded by the respective transmitting area 130, no additional mechanical support is required for the absorbing area 140.

If the pattern lines 100, 110 are transferred onto the wafer without distortion or misalignment, the respective interconnection patterns 120, 121 overlap so that the transmitting area 130 fits into the absorbing area 160. Similarly, the transmitting area 150 fits into the absorbing area 140. There is no overlap and no double exposure.

If the interconnection patterns 120, 121 are transferred with an offset, then some areas of the wafer corresponding to the interconnection patterns 120, 121 are double exposed, while other areas are underexposed. If a photolithographic pattern-transfer apparatus is used, a feature smaller than the resolution limit of the pattern-transfer apparatus is underexposed. Therefore, if the widths of the pattern lines 100, 110 are selected to be approximately equal to or less than the resolution limit of the pattern-transfer apparatus, the width of the transparent section 130 can be empirically determined; usually the width is set slightly wider than the resolution limit. By slightly increasing the width of the transmitting areas 130, 150, a slight offset in the line connection is acceptable even if some areas are double-exposed due to misalignment.

Figure 5A:
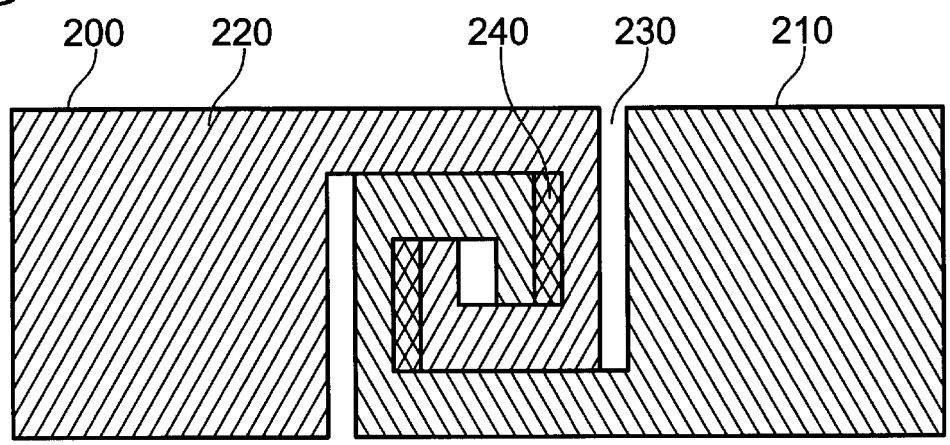
FIGS. 5A–5B are plan views illustrating the connection of the pattern lines and interconnection patterns of FIG. 4 with offsets.

Referring to FIG. 5A, pattern lines 200, 210 of respective sub-fields with interconnection patterns similar to those of FIG. 4 are projected onto a wafer with a misalignment. The misalignment of FIG. 5A is a slight displacement of the images of the pattern lines 200, 210 in an X-direction so that the images of the pattern lines 200, 210 are farther apart than in the absence of the misalignment As a result of this misalignment, an area 240 is double-exposed, an area 220 is correctly exposed, and an area 230 is unexposed Double exposure and underexposure generally result from misalignments.

Figure 5B:
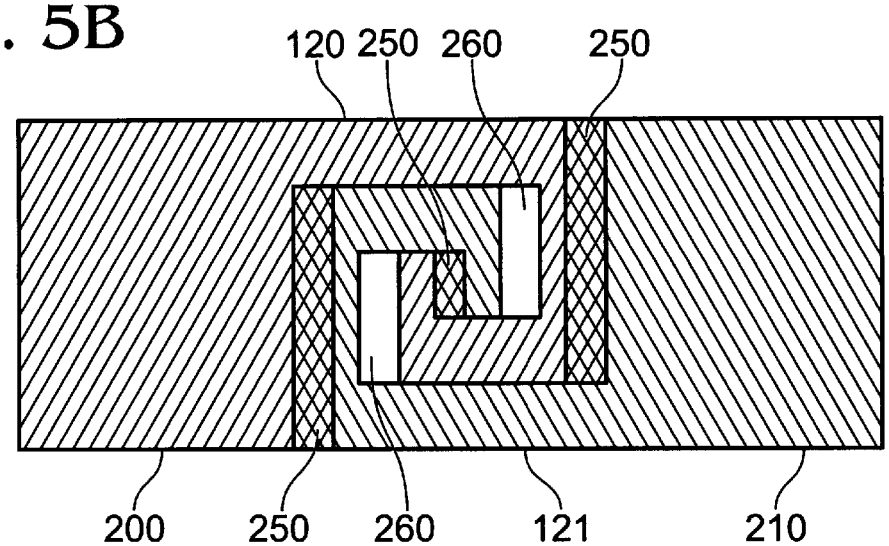

Referring to FIG. 5B, the pattern lines 200, 210 are transferred to the wafer with a misalignment such that the pattern lines 200, 210 are closer together than when perfectly aligned. As a result, areas 250 are overexposed and areas 260 are underexposed. As shown in FIGS. 5A–5B, with interconnection patterns such as interconnection patterns 120, 121, misalignment of patterns does not result in short circuits, open circuits, or breaks in a line pattern. In addition, even if images of pattern lines overlap, only a small area is double exposed.

Figure 6A:
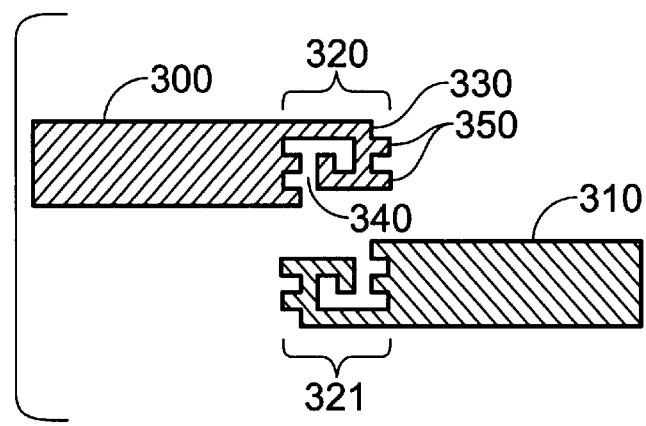
FIG. 6A is a plan view illustrating pattern lines with interconnection patterns according to fourth representative embodiment.

With reference to FIG. 6A, pattern lines 300, 310 of connecting sub-fields (not shown in FIG. 6A) terminate with respective interconnection patterns 320, 321 that overlap as transferred onto the wafer. A transmitting pattern segment 330 and an absorbing pattern segment 340 are shown as hatched and unhatched areas, respectively. The interconnection patterns 320, 321 are complementary so that if transferred to the wafer without alignment error, the patterns overlap with no overexposure or underexposure. The transmitting pattern segment 330 of the interconnection pattern 320 includes teeth 350 (or other serrations) that are repeated at a predetermined interval to prevent overexposure and underexposure.

Figure 6B:
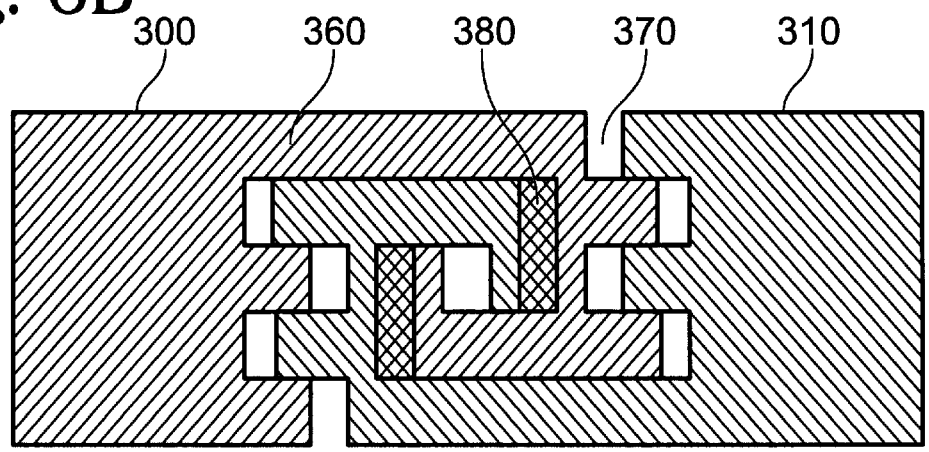
FIG. 6B is a plan view illustrating an the connection of the pattern lines and interconnection patterns of FIG. 6A with an offset.
Figure 7:
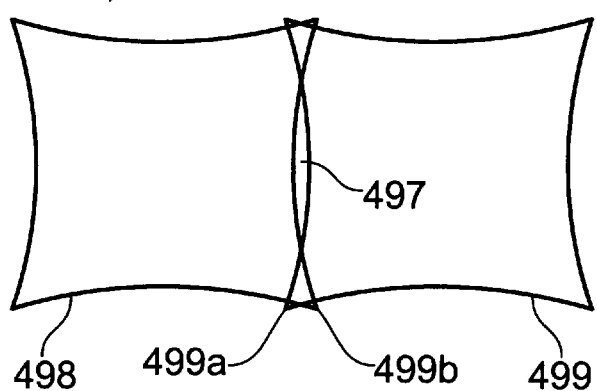
FIG. 7 illustrates a possible distortion of adjacent images of two sub-fields on a wafer as produced in a conventional pattern-transfer apparatus.
Figure 8:
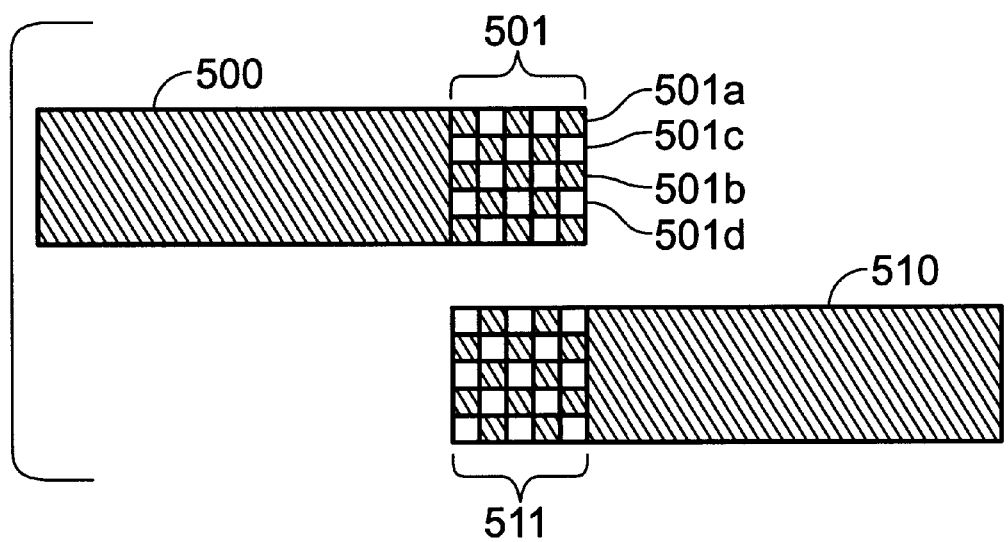
FIG. 8 is a plan view illustrating prior-art pattern lines and interconnection patterns.
Figure 9:
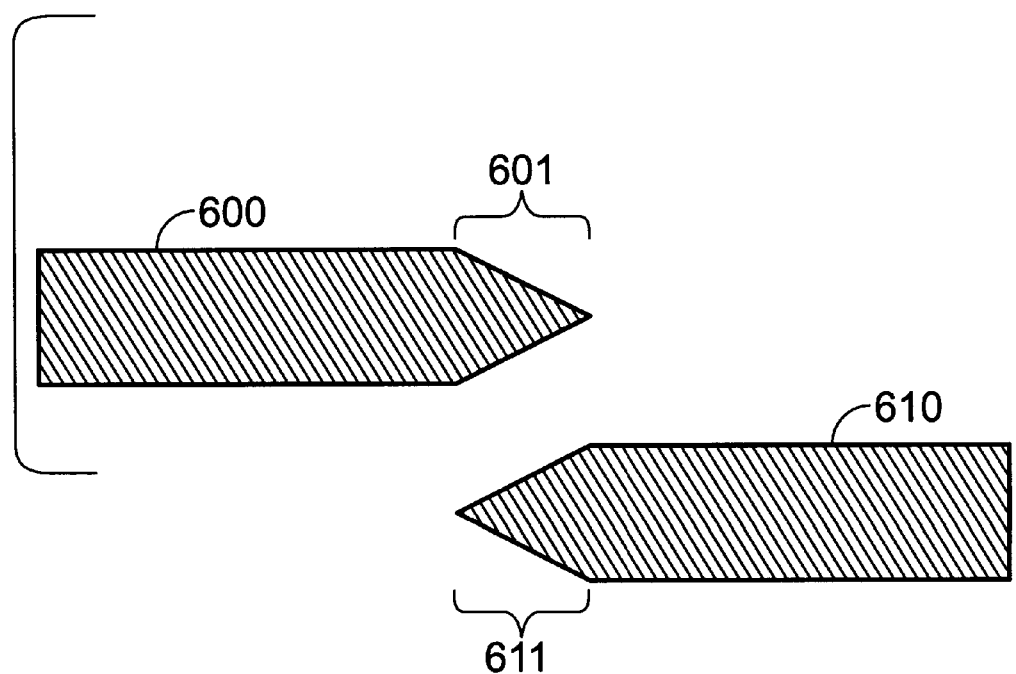
FIG. 9 is a plan view illustrating another prior-art arrangement of pattern lines and interconnection patterns.

FIG. 6B illustrates transfer of the patterns of FIG. 6A to the wafer with the pattern line 310 and the interconnection pattern 321 displaced to the right of perfect alignment A correctly exposed area 360 is hatched in FIG. 6B, an unexposed area 370 is shown without hatch marks, and a double-exposed area 380 is shown as a dark area. It is apparent that, the possibility of breakage or cutoff of the a line pattern is reduced. Thus, the interconnection patterns 320, 321 of FIG. 6A are more effective than the square-spiral interconnection patterns 120, 121 of FIG. 4.

The absorbing pattern segments are continuous sections that do not require additional structural support; a supporting transmitting layer is unnecessary. Transmitting pattern segments can be holes in an absorbing layer. Such a mask construction is simple and avoids image contrast loss and thermal effects caused by transmission of the CPB (or Light flux) through a supporting transmitting layer of a two-layer mask.

Furthermore, the interconnection patterns 320, 321 that overlap and connect on the wafer include transparent and absorbing segments having complementary square-spiral patterns. Because the transmitting and absorbing pattern segments alternate in directions parallel to and perpendicular to the both the pattern lines 300, 310, breaks in the line pattern and double-exposure are prevented even if the interconnection patterns 320, 321 are misaligned. If the double-exposed area is large, features on the wafer are larger than intended. The interconnection patterns of FIG. 5 reduce the area that receives a double exposure, even with pattern misalignment and the pattern lines 300, 310 form a smooth, continuous line on the wafer, with reduced underexposure and underexposure.

While the invention has been described by way of an exemplary embodiments, it is understood that many changes and substitutions may be made by those skilled in the art with without departing from the spirit and the scope of the invention, which is defined by the appended claims.

What is claimed is:

1. A mask for transferring a pattern to a wafer or other substrate, comprising a plurality of sub-fields including pattern lines and interconnection patterns, the interconnection patterns including transmitting pattern segments with widths that change monotonically in a longitudinal direction.

2. A pattern-transfer mask defining a circuit pattern and divided into sub-fields that are projected onto a wafer with an optical system, the mask comprising pattern lines defined in the sub-fields, the pattern lines terminating at interconnection patterns having longitudinally arranged transmitting pattern segments, wherein the widths of the pattern segments are less than a resolution limit of the optical system.

3. A mask for transferring patterns to a wafer or other substrate, comprising a plurality of pattern lines, the pattern lines being terminated by respective interconnection patterns having alternating transmitting and absorbing pattern segments, wherein the transmitting pattern segments of the interconnection patterns include a square-spiral pattern and the interconnection patterns of at least two of the sub-fields are complementary to each other.

4. A mask, comprising a plurality of sub-fields defining a plurality of pattern lines terminated at respective first ends by interconnection patterns, the interconnection patterns including transmitting and absorbing pattern segments arranged in a square-spiral pattern.

5. The mask of claim 4, wherein the square-spiral pattern includes teeth or serrations.

6. A mask for transferring a pattern to a wafer using an optical system having a resolution limit, the mask comprising interconnection patterns including respective pattern segments having widths less than or equal to the resolution limit.

7. A mask for transferring a pattern to a wafer with an optical system having a resolution limit, the mask comprising a plurality of sub-fields containing portions of the pattern and interconnection patterns for connecting patterns of two or more of the sub-fields on the wafer, the interconnection pattern of at least one pattern segment including an alternating series of transmitting and absorbing pattern segments, the widths of the transmitting segments of the interconnection pattern varying substantially in the ratio 9:8:7:6:5:4:3:2:1 progressing longitudinally toward a perimeter of the sub-field.

* * * * *

UNITED STATES PATENT AND TRADEMARK OFFICE
CERTIFICATE OF CORRECTION

PATENT NO. : 6,194,102 B1
DATED : February 27, 2001
INVENTOR(S) : Mamoru Nakasuji and Koichi Kamijo It is certified that error appears in the above-identified patent and that said Letters Patent is hereby corrected as shown below:

Abstract,
Line 5, "wafer The" should be changed to -- wafer. The --.

Column 4,
Line 54, "on" should be deleted.

Column 5,
Line 40, "mask," should be changed to -- mask. --.
Line 52, "other of" should be deleted.
Line 54, "respectively" should be changed to -- respectively. --.

Column 6,
Line 22, "stripe" should be changed to -- stripe. --.

Column 7,
Line 67, "5S" should be changed to -- 50 --.

Column 9,
Line 40, "86, 86" should be changed to -- 86, 87 --.
Line 47, "erg.," should be changed to -- e.g., --.

Column 10,
Line 40, "misalignment" should be changed to -- misalignment. --.
Line 41, "unexposed" should be changed to -- unexposed. --.

Column 11,
Line 3, "alignment" should be changed to -- alignment. --.
Line 7, "a" should be deleted.
Line 23, "the" should be deleted.
Line 30, "underexposure" should be changed to -- overexposure --.

UNITED STATES PATENT AND TRADEMARK OFFICE
CERTIFICATE OF CORRECTION

PATENT NO. : 6,194,102 B1
DATED : February 27, 2001
INVENTOR(S) : Mamoru Nakasuji and Koichi Kamijo It is certified that error appears in the above-identified patent and that said Letters Patent is hereby corrected as shown below:

<u>Column 11 (cont.),</u>
Line 32, "an" should be deleted.
Line 35, "with" should be deleted.

Signed and Sealed this

Thirteenth Day of November, 2001

Attest:

*Attesting Officer*

NICHOLAS P. GODICI
*Acting Director of the United States Patent and Trademark Office*